United States Patent
Xie

(10) Patent No.: US 10,586,874 B2
(45) Date of Patent: Mar. 10, 2020

(54) THIN FILM TRANSISTOR AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Huafei Xie, Guangdong (CN)

(73) Assignee: Shenzhen China Star Optoelectronics Semiconductor Display Technology Co., Ltd, Shenzhen, Guangdong (CN)

(*) Notice: Subject to any disclaimer, the term of this patent is extended or adjusted under 35 U.S.C. 154(b) by 368 days.

(21) Appl. No.: 15/528,742

(22) PCT Filed: Apr. 20, 2017

(86) PCT No.: PCT/CN2017/081241
§ 371 (c)(1),
(2) Date: May 22, 2017

(87) PCT Pub. No.: WO2018/170985
PCT Pub. Date: Sep. 27, 2018

(65) Prior Publication Data
US 2019/0097065 A1 Mar. 28, 2019

(30) Foreign Application Priority Data
Mar. 24, 2017 (CN) .......................... 2017 1 0181508

(51) Int. Cl.
*H01L 29/786* (2006.01)
*B82Y 10/00* (2011.01)
(Continued)

(52) U.S. Cl.
CPC ........ *H01L 29/78696* (2013.01); *B82Y 10/00* (2013.01); *B82Y 40/00* (2013.01);
(Continued)

(58) Field of Classification Search
CPC ............. H01L 29/0665; H01L 29/0669; H01L 29/0673; H01L 29/0676; H01L 29/068;
(Continued)

(56) References Cited

U.S. PATENT DOCUMENTS

2003/0073258 A1 4/2003 Mukai et al.
2005/0227444 A1 10/2005 Ponomarev et al.
(Continued)

FOREIGN PATENT DOCUMENTS

CN 101110448 A 1/2008
CN 101350364 A 1/2009
(Continued)

*Primary Examiner* — Tucker J Wright
*Assistant Examiner* — Scott Stowe
(74) *Attorney, Agent, or Firm* — Andrew C. Cheng

(57) ABSTRACT

The disclosure discloses a thin film transistor and a manufacturing method thereof. The method includes depositing quantum dot ink containing carbon quantum dots in a groove region between a source electrode and a drain electrode, after the quantum dot ink is dry, cleaning and blow-drying the dried quantum dot ink to film the carbon quantum dots to be an active layer of the thin film transistor. Accordingly, the disclosure can simplify the manufacturing process of the thin film transistor and enhance the production efficiency, as well as reducing costs and improving control sensitivity.

7 Claims, 4 Drawing Sheets

(51) Int. Cl.
  *B82Y 40/00*   (2011.01)
  *H01L 29/66*   (2006.01)
  *H01L 21/02*   (2006.01)
  *H01L 29/15*   (2006.01)
  *H01L 29/16*   (2006.01)
  *H01L 29/06*   (2006.01)

(52) U.S. Cl.
  CPC .. *H01L 21/02527* (2013.01); *H01L 21/02601* (2013.01); *H01L 21/02628* (2013.01); *H01L 29/0665* (2013.01); *H01L 29/15* (2013.01); *H01L 29/16* (2013.01); *H01L 29/66045* (2013.01); *H01L 29/66227* (2013.01); *H01L 29/66439* (2013.01); *H01L 29/78684* (2013.01); *H01L 21/02658* (2013.01)

(58) Field of Classification Search
  CPC ......... H01L 29/78696; H01L 29/66045; H01L 29/15; H01L 29/16; H01L 21/02527; H01L 21/02601; H01L 21/02628
  See application file for complete search history.

(56) References Cited

U.S. PATENT DOCUMENTS

| | | |
|---|---|---|
| 2015/0243849 A1 | 8/2015 | Stroetmann |
| 2017/0186776 A1* | 6/2017 | Kang .................... G02F 1/1368 |
| 2017/0261788 A1 | 9/2017 | Cheng et al. |

FOREIGN PATENT DOCUMENTS

| | | |
|---|---|---|
| CN | 104051275 A | 9/2014 |
| CN | 104882383 A | 9/2015 |

* cited by examiner

THIN FILM TRANSISTOR AND MANUFACTURING METHOD THEREOF

FIELD OF THE DISCLOSURE

The disclosure relates to a display field, and more particularly to a thin film transistor and a manufacturing method thereof.

BACKGROUND

With the development of science and technology, as well as the advancement of the society, the reliance on storing, transmitting and processing information is increasing. Semiconductor devices and the processing technology as primary carriers and material foundations of storage, transmission and process of information have been hot spots of issues studied by numerous scientists. A thin film transistors (TFT) as a critical semiconductor device has been widely applied in the industry. However, conventional TFTs generally are semiconductor devices based on the microelectronic silicon process, the active layer thereof is produced by multiple processes such as coating photoresist, exposure, development, etching, etc. The manufacturing process is complex, and costs cannot be reduced due to the low-efficient production. Moreover, TFTs based on the microelectronic silicon process can hardly meet the requirement of modern information society on high sensitivity due to gradual improvement of needs on high performance TFTs.

SUMMARY

Accordingly, the disclosure provides a thin film transistor and a manufacturing method thereof, which can simplify the manufacturing process and enhance the production efficiency, as well as reducing costs and improving control sensitivity.

A manufacturing method of a thin film transistor of an embodiment of the disclosure includes forming a first groove and a second groove disposed separately in a base material by a process of nanoimprint, pre-processing the first groove and the second groove before plating to clean and smooth internal surfaces of the first groove and the second groove, filling conductive slurries in the first groove and the second groove being pre-processed before plating respectively to obtain electrode bases, forming a source electrode and a drain electrode respectively on the electrode bases by a brush plating process, forming a groove region between the source electrode and the drain electrode, processing the source electrode and the drain electrode after plating to clean residue on surfaces of the source electrode and the drain electrode, depositing quantum dot ink containing carbon quantum dots in the groove region, after the quantum dot ink is dry, cleaning and blow-drying the dried quantum dot ink to film the carbon quantum dots to be an active layer of the thin film transistor, forming an insulating layer to cover the active layer, the source electrode and the drain electrode by a spin coating process, and forming a gate electrode on the insulating layer by a spray printing process.

A manufacturing method of a thin film transistor of an embodiment of the disclosure includes forming a source electrode and a drain electrode disposed separately on a base material, forming a groove region between the source electrode and the drain electrode, depositing quantum dot ink containing carbon quantum dots in the groove region, after the quantum dot ink is dry, cleaning and blow-drying the dried quantum dot ink to film the carbon quantum dots to be an active layer of the thin film transistor.

A thin film transistor of an embodiment of the disclosure includes a source electrode and a drain electrode on a base material, and an active layer in the groove region.

The source electrode and the drain electrode are disposed separately, and a groove region is formed between the source electrode and the drain electrode.

The active layer includes a carbon quantum dot film.

According to the embodiments above, the disclosure deposits the quantum dot ink containing carbon quantum dots in the groove region between the source electrode and the drain electrode. The active layer is prepared by drying, cleansing and blow-drying. The processes such as coating photoresist, exposure, development, etching, etc. are unnecessary in manufacturing the active layer, which can simplify the manufacturing process of the thin film transistor and enhance the production efficiency, as well as reducing costs. The active layer thoroughly utilizes superior electrical properties of the carbon quantum dots to improve control sensitivity.

DETAILED DESCRIPTION OF PREFERRED EMBODIMENTS

A main objective of the disclosure is to prepare an active layer of a thin film transistor by quantum dot ink. Specifically, the quantum dot ink containing quantum dots can be deposited in a groove region between a source electrode and a drain electrode. The active layer is obtained by drying, cleansing and blow-drying. The active layer can be applied in a top-gate thin film transistor as well as a bottom-gate thin film transistor.

Each embodiment of the disclosure will be described clearly and integrally with reference to the accompanying drawings as follows. Features of the embodiments below can be combined under a condition without conflict.

Figure 1:
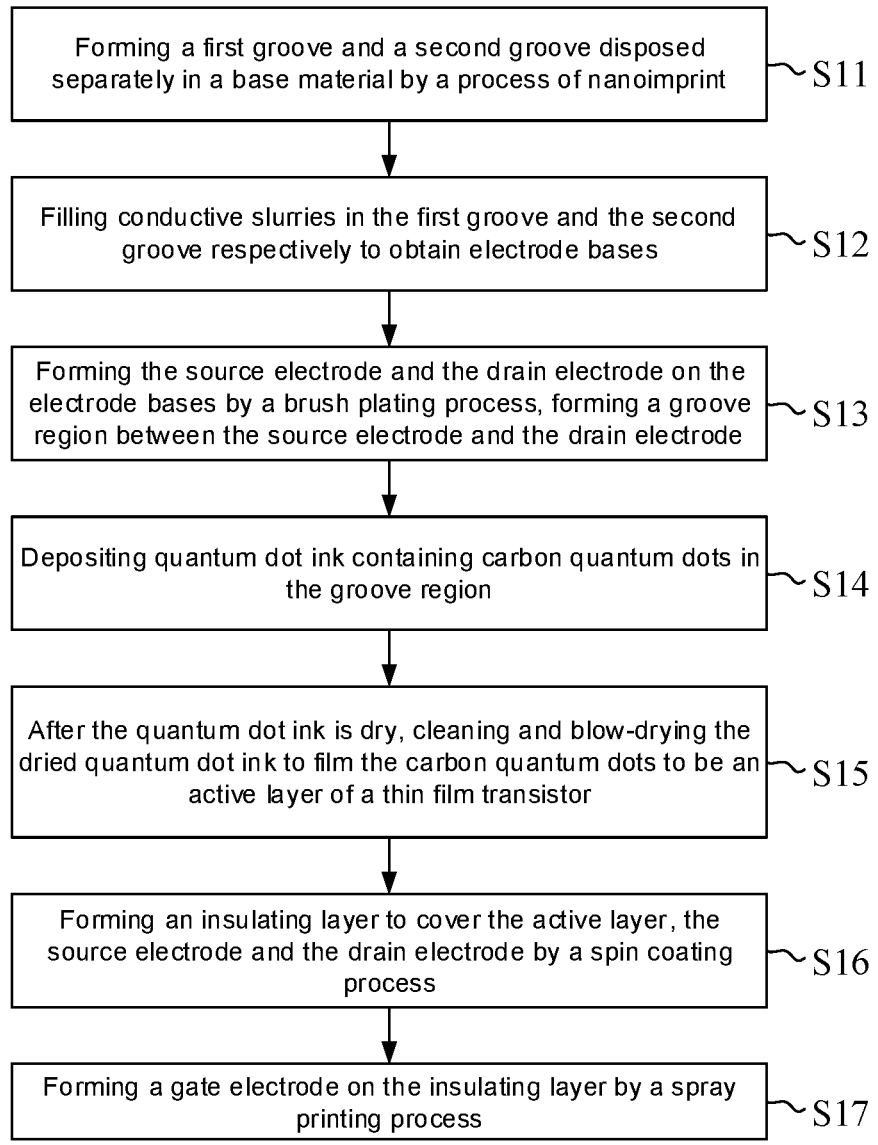
FIG. 1 is a schematic flowchart of a manufacturing method of a thin film transistor according to an embodiment of the disclosure.

Referring to FIG. 1, FIG. 1 is a schematic flowchart of a manufacturing method of a thin film transistor according to an embodiment of the disclosure. The manufacturing method of a thin film transistor can include steps S11~S17 as follows.

S11: Forming a first groove and a second groove disposed separately in a base material by a process of nanoimprint.

Figure 2:
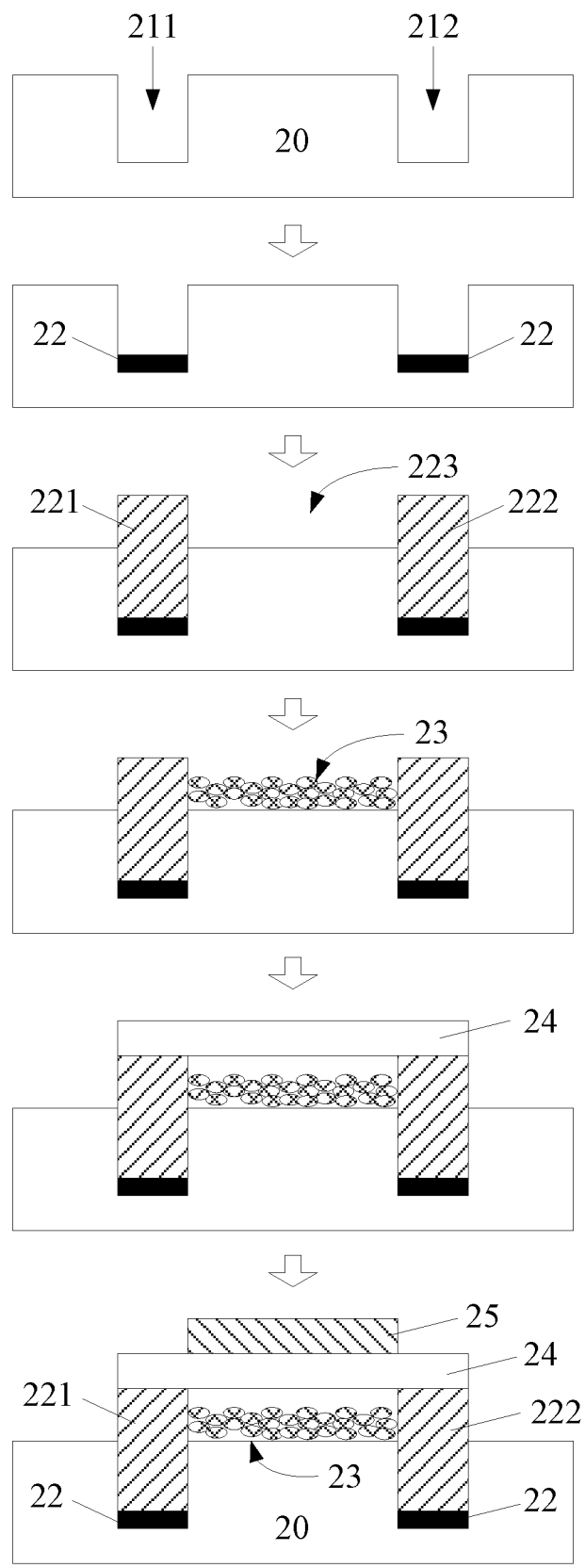
FIG. 2 is a schematic view of forming a thin film transistor on a base material according to the method shown in FIG. 1.

Referring to FIG. 2, the nanoimprint process is a pattern process in a scale of nanometers. A first groove 211 and a second groove 212 can be formed on a base material 20 by photoetching. The base material 20 includes but is not restricted to polyethylene terephthalate (PET) material and polyimide material.

S12: Filling conductive slurries in the first groove and the second groove respectively to obtain electrode bases.

The conductive slurries include but are not restricted to conductive silver slurries, conductive copper slurries, conductive aluminum slurries, etc. Electrode bases 22 formed by solidification are configured to enhance adhesive strength between a source electrode 221, a drain electrode 222 and the base material 20 made out of plastic. For instance, the adhesive effect between the source electrode 221 and the drain electrode 222 that are made out of metal and the base material 20 made out of plastic is inferior, but the electrode bases 22 obtained by solidification of conductive slurries have an excellent adhesive effect on metal and plastic.

S13: Forming the source electrode and the drain electrode respectively on the electrode bases by a brush plating process, forming a groove region between the source electrode and the drain electrode.

The embodiment can connect the base material 20 to a cathode. A plating pen immersed with the plating solution is used as an anode. The plating solution undergoes an electrolytic reaction subject to a DC electric field. Metallic ions in the plating solution are deposited on the surface of the base material 20 after receiving electrons. In the brush plating process, metallic layers with a certain thickness can be formed on the electrode bases 22 of the two grooves by controlling the plating pen to move relatively to the electrode bases 22 in the first groove 211 and the second groove 212. The metallic layer in the first groove 211 is the source electrode 221, and the metallic layer in the second groove 212 is the drain electrode 222. A groove region 223 is defined between the source electrode 221 and the drain electrode 222.

Obviously, the source electrode 221 and the drain electrode 222 can be formed in the first groove 211 and the second groove 212 directly rather than filling in conductive slurries in other embodiments, which can skip the process with regard to the electrode bases 22.

In practical application, the embodiment can adopt metal such as gold, aluminum, copper, silver, chromium and so on whose work function is larger than a predetermined threshold to prepare the source electrode 221 and the drain electrode 222. The predetermined threshold can be adjusted according to practical situations. The voltage of the brush plating process can be 2.0~5.0V.

Furthermore, the embodiment can pre-process the first groove 211 and the second groove 212 before brush plating to clean and smooth internal surfaces of the grooves. Moreover, the source electrode 221 and the drain electrode 222 are processed after brush plating to clean residue on surfaces of the two.

S14: Depositing quantum dot ink containing carbon quantum dots in the groove region.

The embodiment can adopt a filter membrane to filter carbon quantum dots dissolved in organic solutions with low boiling points and weak polarities such as octane, chloroform, hexane, methylbenzene and so on to remove clusters therein for obtaining the quantum dot ink. The filter membrane can be an organic membrane with 0.22 μm filtration pores.

Furthermore, the quantum dot ink is deposited in the groove region 223 between the source electrode 221 and the drain electrode 222 by printing or drop-coating.

S15: After the quantum dot ink is dry, cleaning and blow-drying the dried quantum dot ink to film the carbon quantum dots to be an active layer of the thin film transistor.

After the quantum dot ink is dry, the carbon quantum dots therein are deposited to be a layer of film on the groove region 223. Moreover, dissolvent with low boiling points and strong polarities such as methanol, ethanol, acetone, etc. can be adopted to clean the layer of film, and nitrogen can be utilized for blow-drying to remove impurities such as organic compounds. In order to guarantee the removal effect of the impurities, the embodiment can clean and blow-dry the film repeatedly, such as 4 times. Thus, an active layer 23 formed by carbon quantum dots can be prepared.

S16: Forming an insulating layer to cover the active layer, the source electrode and the drain electrode by a spin coating process.

Referring to FIG. 2, a dielectric layer is spin coated above the active layer 23, the source electrode 221 and the drain electrode 222. The dielectric layer can be an inorganic dielectric layer containing at least one of barium titanate, hafnium oxide and titanium dioxide, or an organic dielectric layer containing at least one of polyvinylidene fluoride (PVDF), polymethyl methacrylate (PMMA), polyimide (PI), poly(vinyl phenol) (PVPh), polyvinyl alcohol (PVA) and polystyrene (PS).

The structural member spin coated with the dielectric layer is placed in an oven to be heated at 150° C. for 30 seconds. The solution in the dielectric layer evaporates. An insulating layer 24 can be obtained by film-formation after cooling.

S17: Forming a gate electrode on the insulating layer by a spray printing process.

According to the embodiment, the conductive ink containing any one metallic particles such as gold, silver, copper, etc. can be sprayed and printed on the insulating layer 24. The solution in the conductive ink evaporates by heating at 100° C. for 30 minutes. A gate electrode 25 is the metallic layer obtained after cooling.

Hereby, the top-gate thin film transistor can be produced according to the embodiment.

It can be known from the description above that the embodiment deposits the quantum dot ink containing carbon quantum dots in the groove region 233 between the source electrode 221 and the drain electrode 222, and obtaining the active layer 23 by drying, cleaning and blow-drying. Compared with the prior art, the embodiment can produce the active layer 23 without the processes such as coating photoresist, exposure, development, etching, etc., which can simplify the manufacturing process of the thin film transistor and enhance the production efficiency, as well as reducing costs. The active layer 23 thoroughly utilizes superior electrical properties of the carbon quantum dots to improve control sensitivity of the thin film transistor.

Furthermore, manufacturing processes of the source electrode 221, the drain electrode 222, the active layer 23, the insulating layer 24 and the gate electrode 25 all can be achieved by corresponding solutions. Accordingly, the embodiment can be regarded as a process of manufacturing thin film transistors based on a full-solution method. According to fluidity of the solution and the even thickness of the film, the embodiment can form each layer of structures described above on the flexible base material 20. In other words, the disclosure can be benefit for the flexible design of a display panel.

Furthermore, as the active layer 23 is formed by carbon quantum dots, the embodiment can reduce the reliance on metallic elements. Compared with metallic quantum dots, carbon quantum dots are nontoxic and relatively friendly to the environment, as well as inexpensive. Obviously, in the process of manufacturing thin film transistors by the full-solution method, other embodiments of the disclosure can adopt metallic quantum dots or other types of quantum dots to prepare the active layer 23, which can extend the raw materials of the process.

The disclosure further provides a thin film transistor of an embodiment, which can be produced by the method shown in FIG. 1 and FIG. 2. The structure can be referred to FIG. 2, which will not be repeated.

Figure 3:
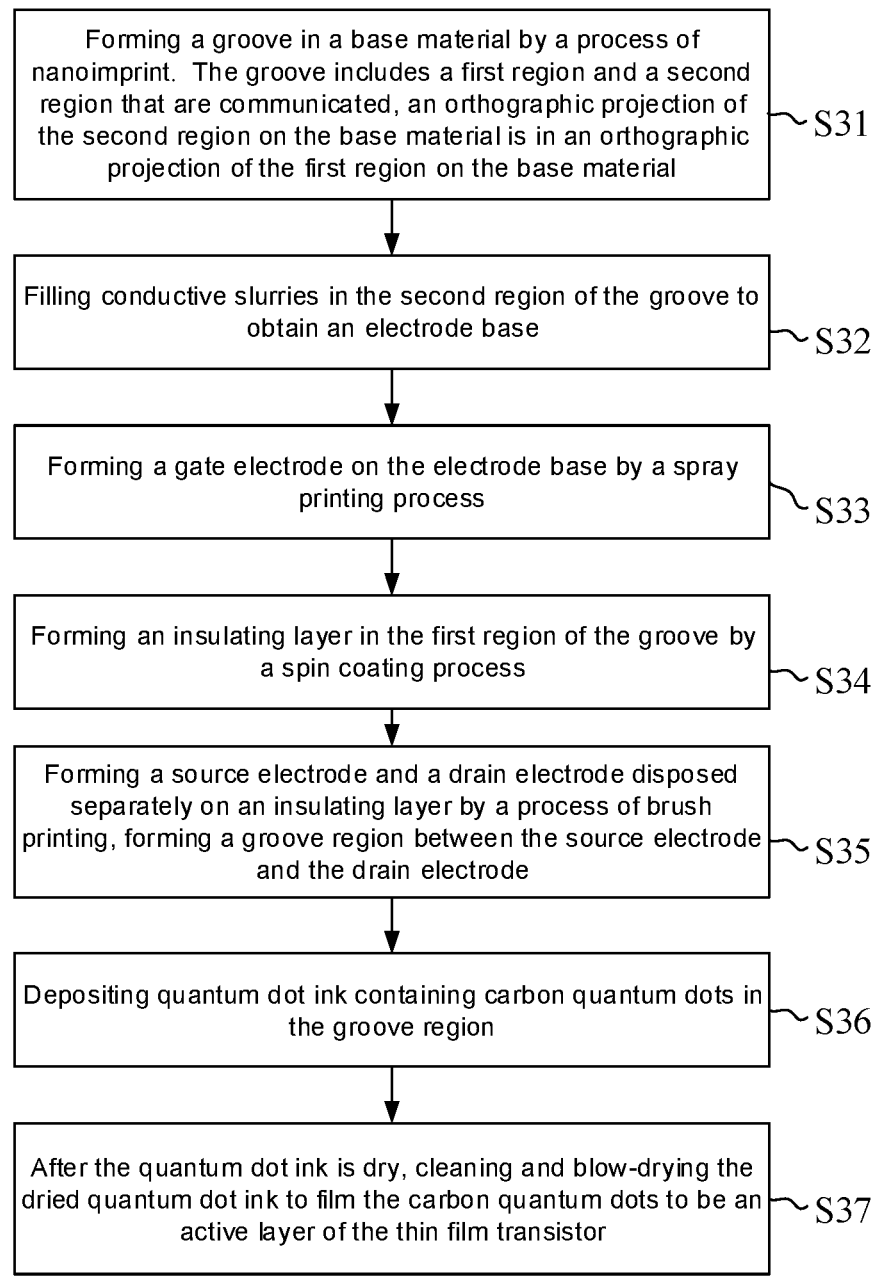
FIG. 3 is a schematic flowchart of a manufacturing method of a thin film transistor according to another embodiment of the disclosure.

Referring to FIG. 3, FIG. 3 is a schematic flowchart of a manufacturing method of a thin film transistor according to another embodiment of the disclosure. The manufacturing method of a thin film transistor can include steps S31~S37 as follows.

S31: Forming a groove in a base material by a process of nanoimprint. The groove includes a first region and a second region that are communicated. An orthographic projection of the second region on the base material is in an orthographic projection of the first region on the base material.

Figure 4:
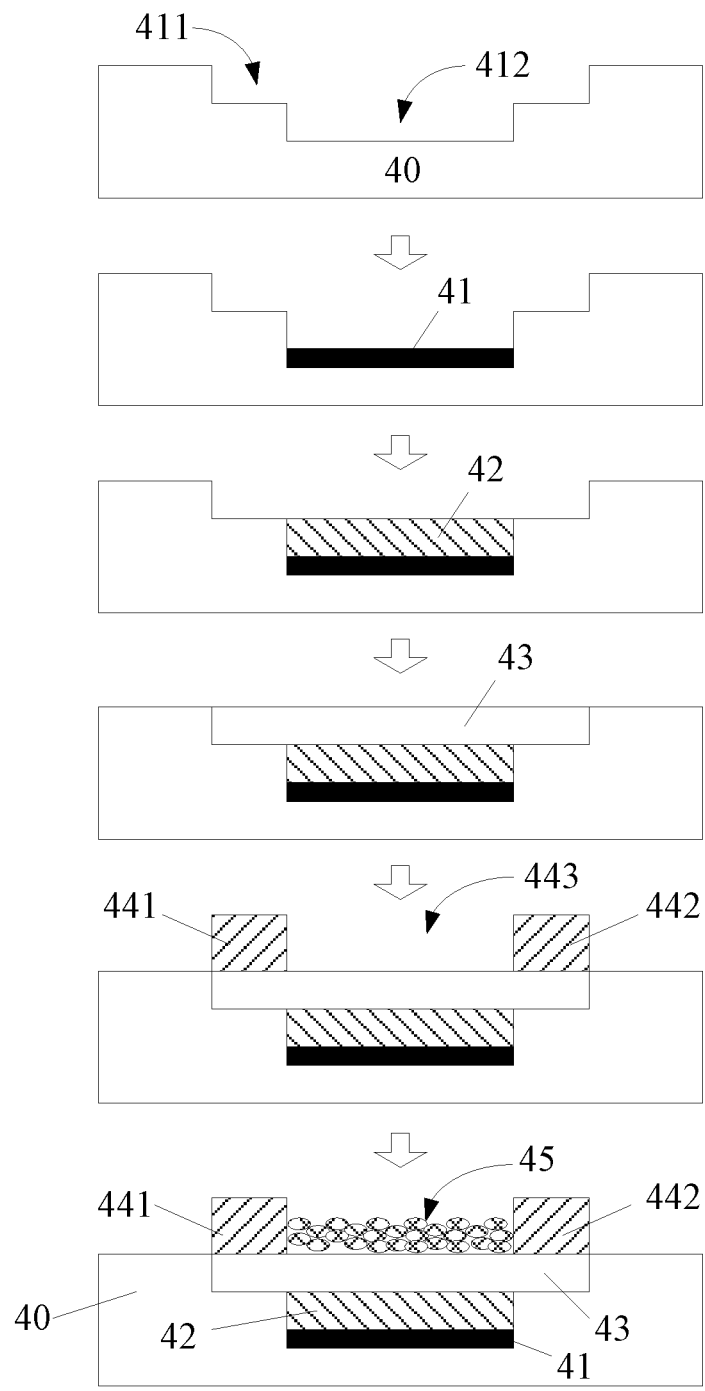
FIG. 4 is a schematic view of forming a thin film transistor on a base material according to the method shown in FIG. 3.

Referring to FIG. 4, the first region 411 is above the second region 412. In a cross-sectional surface along a base material 40, the length of the second region 412 is less than the length of the first region 411.

S32: Filling conductive slurries in the second region of the groove to obtain an electrode base.

S33: Forming a gate electrode on the electrode base by a spray printing process.

According to the embodiment, the conductive ink containing any one metallic particles such as gold, silver, copper, etc. can be sprayed and printed on an electrode base 41. The solution in the conductive ink evaporates by heating at 100° C. for 30 minutes. A gate electrode 42 is the metallic layer obtained after cooling.

Obviously, the gate electrode 42 can be formed in the second region 412 directly rather than filling in conductive slurries in other embodiments, which can skip the process with regard to the electrode base 41.

S34: Forming an insulating layer in the first region of the groove by a spin coating process.

S35: Forming a source electrode and a drain electrode disposed separately on an insulating layer by a process of brush printing, forming a groove region between the source electrode and the drain electrode.

The embodiment can connect an insulating layer 43 to a cathode. A plating pen immersed with the plating solution is used as an anode. The plating solution undergoes an electrolytic reaction subject to a DC electric field. Metallic ions in the plating solution are deposited on the surface of the insulating layer 43 after receiving electrons. In the brush plating process, two metallic layers with a certain thickness can be formed by controlling the plating pen to move relatively to the insulating layer 43. One of the metallic layers is a source electrode 441, and the other metallic layer is a drain electrode 442. A groove region 443 is defined between the source electrode 441 and the drain electrode 442.

S36: Depositing quantum dot ink containing carbon quantum dots in the groove region.

S37: After the quantum dot ink is dry, cleaning and blow-drying the dried quantum dot ink to film the carbon quantum dots to be an active layer of the thin film transistor.

The principle and processes of forming an active layer 45 in the embodiment can be referred to the embodiment above, which will not be repeated. Accordingly, the embodiment can produce the bottom-gate thin film transistor.

As manufacturing processes of the source electrode 441, the drain electrode 442, the active layer 45, the insulating layer 43 and the gate electrode 42 can be identical to the manufacturing processes of each structure of the top-gate thin film transistor described above, the embodiment has the beneficial effects as described above.

The disclosure further provides a thin film transistor of another embodiment, which can be produced by the method shown in FIG. 3 and FIG. 4. The structure thereof can be referred to FIG. 4, which will not be repeated.

It should be understood that the description above is merely embodiments of the disclosure, which cannot limit the protection scope of the disclosure. Any equivalent structure or process according to contents of the disclosure and the figures, such as combination of technical features in each of the embodiments, or direct or indirect application in other related fields should be included in the protected scope of the disclosure.

What is claimed is:

1. A manufacturing method of a thin film transistor, the method comprising:

forming a first groove and a second groove disposed separately in a base material by a process of nanoimprint;

pre-processing the first groove and the second groove before plating to clean and smooth internal surfaces of the first groove and the second groove;

filling conductive slurries in the first groove and the second groove being pre-processed before plating respectively to obtain electrode bases;

forming a source electrode and a drain electrode respectively on the electrode bases by a brush plating process, forming a groove region between the source electrode and the drain electrode;

processing the source electrode and the drain electrode after plating to clean residue on surfaces of the source electrode and the drain electrode;

depositing quantum dot ink containing carbon quantum dots in the groove region;

after the quantum dot ink is dry, cleaning and blow-drying the dried quantum dot ink to film the carbon quantum dots to be an active layer of the thin film transistor;

forming an insulating layer to cover the active layer, the source electrode and the drain electrode by a spin coating process;

forming a gate electrode on the insulating layer by a spray printing process.

2. The method according to claim 1, wherein the process of forming the source electrode and the drain electrode respectively in the first groove and the second groove by a brush plating process comprises:

filling conductive slurries in the first groove and the second groove respectively to obtain electrode bases;

forming the source electrode and the drain electrode on the electrode bases.

3. A manufacturing method of a thin film transistor, the method comprising:

forming a source electrode and a drain electrode disposed separately on a base material, forming a groove region between the source electrode and the drain electrode;

depositing quantum dot ink containing carbon quantum dots in the groove region;

after the quantum dot ink is dry, cleaning and blow-drying the dried quantum dot ink to film the carbon quantum dots to be an active layer of the thin film transistor;

wherein the process of forming a source electrode and a drain electrode disposed separately on a base material comprises:

forming a first groove and a second groove disposed separately in the base material by a process of nanoimprint;

forming the source electrode and the drain electrode respectively in the first groove and the second groove by a brush plating process;

after filming the carbon quantum dots to be the active layer of the thin film transistor, the method comprises:

forming an insulating layer to cover the active layer, the source electrode and the drain electrode by a spin coating process;

forming a gate electrode on the insulating layer by a spray printing process;

or, before forming the source electrode and the drain electrode disposed separately on the base material, the method comprises:

forming a recess in the base material by a process of nanoimprint, the recess comprises a first region and a second region that are communicated, an orthographic projection of the second region on the base material is in an orthographic projection of the first region on the base material;

forming a gate electrode in the second region of the recess by a spray printing process;

forming an insulating layer in the first region of the recess by a spin coating process;

the process of forming a source electrode and a drain electrode disposed separately on a base material comprises:

forming the source electrode and the drain electrode disposed separately on the insulating layer.

4. The method according to claim 3, wherein the process of forming a gate electrode in the second region of the recess by a spray printing process comprises: filling conductive slurries in the second region of the recess to obtain an electrode base; forming the gate electrode on the electrode base by a spray printing process.

5. A thin film transistor, comprising:

a source electrode and a drain electrode on a base material, the source electrode and the drain electrode disposed separately, and a groove region formed between the source electrode and the drain electrode;

an active layer in the groove region, the active layer comprising a carbon quantum dot film;

wherein the thin film transistor further comprises an insulating layer and a gate electrode formed above the active layer in sequence, the base material is defined with a first groove and a second groove disposed separately, the source electrode and the drain electrode are disposed in the first groove and the second groove respectively, the insulating layer covers the active layer, the source electrode and the drain electrode;

or, the thin film transistor further comprises an insulating layer and a gate electrode formed below the active layer in sequence, the base material is defined with a recess, the recess comprises a first region and a second region that are communicated, an orthographic projection of the second region on the base material is in an orthographic projection of the first region on the base material, the gate electrode is in the second region, the insulating layer is in the first region.

6. The thin film transistor according to claim 5, wherein the thin film transistor further comprises electrode bases formed in the first groove and the second groove, the source electrode and the drain electrode are disposed on the electrode bases respectively.

7. The thin film transistor according to claim 5, wherein the thin film transistor further comprises an electrode base formed in the first region, the gate electrode is disposed on the electrode base.

* * * * *